(12) United States Patent
Loomis et al.

(10) Patent No.: US 6,194,734 B1
(45) Date of Patent: Feb. 27, 2001

(54) METHOD AND SYSTEM FOR OPERATING A VARIABLE APERTURE IN AN ION IMPLANTER

(75) Inventors: Paul A. Loomis, Georgetown; Hans J. Rutishauser, Lexington; Jun Lu, Beverly, all of MA (US); Michiro Sugitani; Toru Murakami, both of Niihama (JP); Hiroshi Sogabe, Saijo (JP)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/253,374

(22) Filed: Feb. 19, 1999

(51) Int. Cl.[7] .................................................. H01J 37/317
(52) U.S. Cl. ...................................... 250/492.21; 250/397
(58) Field of Search ........................ 250/492.21, 398, 250/397, 492.2

(56) References Cited

U.S. PATENT DOCUMENTS

| | | | |
|---|---|---|---|
| 4,017,403 | 4/1977 | Freeman | 250/492 A |
| 4,804,879 | 2/1989 | Fukumoto | 313/361.1 |
| 5,130,552 | 7/1992 | Bright et al. | 250/492.2 |
| 5,216,253 | * 6/1993 | Koike | 250/492.21 |
| 5,640,012 | * 6/1997 | Krivanek | 250/305 |
| 5,780,863 | * 7/1998 | Benveniste et al. | 250/492.21 |
| 5,998,798 | * 12/1999 | Halling et al. | 250/492.21 |

* cited by examiner

Primary Examiner—Kiet T. Nguyen
(74) Attorney, Agent, or Firm—John A. Kastelic (57) ABSTRACT

A system and method are provided for operating a variable aperture (30) for adjusting the amount of ion beam current passing therethrough in an ion implantation system (10). The system and method comprise means or steps for (i) measuring ion beam current at an implanter location using a current detector (35); (ii) comparing the measured ion beam current with a desired ion beam current; (iii) outputting a control signal (126, 128) based on the comparison of the measured ion beam current with the desired ion beam current; and (iv) adjusting a gap (50), through which through ion beam passes and which is defined by opposing first and second aperture plates (44A, 44B), in response to the control signal to control the amount of ion beam current passing therethrough. The current detector (35) provides ion beam current feedback, and a position sensor (116, 118) may be utilized to provide aperture plate (44A, 44B) position feedback. The system and method provide a quick, direct, and precise mechanism for effecting significant changes in ion beam current without requiring re-tuning of the source. The gap (50) of the aperture (44) is adjustable in increments of about 5 microns ($\mu$m).

19 Claims, 7 Drawing Sheets

METHOD AND SYSTEM FOR OPERATING A VARIABLE APERTURE IN AN ION IMPLANTER

RELATED APPLICATION

The following U.S. patent application is incorporated by reference herein as if it had been fully set forth: application Ser. No. 09/253,375, filed on Feb. 19, 1999, entitled Continuously Variable Aperture for High-Energy Ion Implanter.

FIELD OF THE INVENTION

The present invention relates generally to ion implantation systems and more particularly to a method and system for operating a variable aperture for use in such systems.

BACKGROUND OF THE INVENTION

Ion implantation has become the technology preferred by industry to dope semiconductors with impurities in the large-scale manufacture of integrated circuits. High-energy ion implanters are used for deep implants into a substrate. Such deep implants are required to create, for example, retrograde wells. Eaton GSD/HE and GSD/VHE ion implanters are examples of such high-energy implanters. These implanters can provide ion beams at energy levels up to 5 MeV (million electron volts). U.S. Pat. No. 4,667,111, assigned to the assignee of the present invention, Eaton Corporation, and describing such a high-energy ion implanter, is incorporated by reference herein as if fully set forth.

Typically, implants are performed on semiconductor substrates in prescribed series of processes or recipes. Each series may include several recipes, each of which requires a particular level of ion beam current. Current methods of adjusting the ion beam current for different recipes involves an initial tuning of the ion beam source for a particular level of beam current, and then re-tuning the source for any subsequent different level of beam current. Such a method, however, can be time consuming and is most detrimental when beam recipes involving a common species (e.g., boron or phosphorous) are connected in a series chain. The time saved by running recipes in series is offset by the time required to re-tune the source between recipes.

It is known to utilize a variably sized aperture in an ion implanter beamline to allow one or more than one isotope of a desired ion to pass through the aperture and be implanted into a substrate. Such an aperture is shown in U.S. Pat. No. 5,130,552, wherein the aperture size is predetermined for each ion implant process and adjusted accordingly. It is not known, however, to provide such an aperture in a high-energy implantation system. Nor is it known to provide a control circuit for such an aperture using ion beam current feedback to permit dynamic adjustment thereof.

It is an object of the present invention, then, to provide an improved adjustable aperture for use in the beamline of an ion implantation system. It is a further object of the invention to provide such an adjustable aperture for use in a high-energy ion implantation system. It is yet a further object to provide a method of controlling such an adjustable aperture, wherein ion beam current is used as a feedback signal to the control system.

SUMMARY OF THE INVENTION

A system and method are provided for operating a variable aperture for adjusting the amount of ion beam current passing therethrough in an ion implantation system. The system and method comprise means or steps for (i) measuring ion beam current at an implanter location using a current detector; (ii) comparing the measured ion beam current with a desired ion beam current; (iii) outputting a control signal based on the comparison of the measured ion beam current with the desired ion beam current; and (iv) adjusting a gap, through which through ion beam passes and which is defined by opposing first and second aperture plates, in response to the control signal to control the amount of ion beam current passing therethrough. The current detector provides ion beam current feedback, and a position sensor may be utilized to provide aperture position feedback. The system and method provide a quick, direct, and precise mechanism for effecting significant changes in ion beam current without requiring re-tuning of the source. The gap of the aperture is adjustable in increments of about 5 microns ($\mu$m).

DETAILED DESCRIPTION OF A PREFERRED EMBODIMENT OF THE INVENTION

Figure 1:
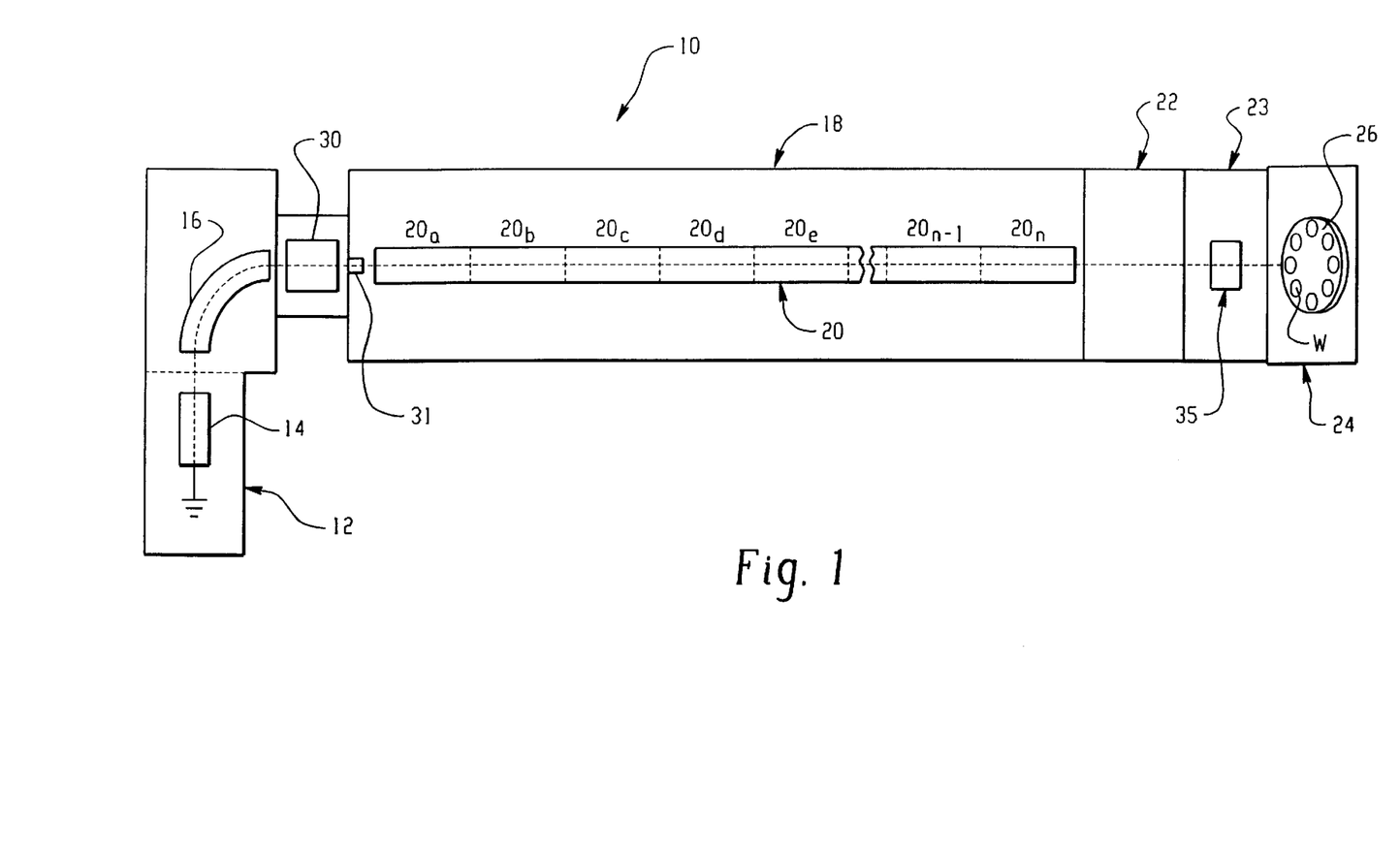
FIG. 1 is a cross sectional plan view of an ion implanter incorporating a continuously variable aperture constructed according to the principles of the present invention.

A cross sectional plan view of a high-energy ion implanter 10 is shown in FIG. 1. The implanter 10 comprises five sections or subsystems: an injector 12 including an ion source 14 for producing an ion beam and a mass analysis magnet 16 for mass analyzing the ion beam; a radio frequency (RF) linear accelerator (linac) 18 including a plurality of resonator modules 20 for accelerating the ion beam to a higher energy; a final energy magnet (FEM) 22 for performing final mass analysis of the accelerated ion beam; a resolver housing 23 for final resolution and conditioning of the ion beam; and an end station 24 which contains a rotating disc 26 carrying wafers W to be implanted by the ion beam. Positioned after the mass analysis magnet 16 at the entrance of the linac 18 is a continuously variable aperture assembly 30 which functions to control the amount of ion beam current which passes from the mass analysis magnet 16 to the linac 18. Located immediately after the continuously variable aperture 30 is a first flag Faraday 31 which is used to measure the beam current out of the aperture 30 and into the linac.

The mass analysis magnet 16 functions to pass to the RF linac 18 only the ions generated by the ion source 14 having an appropriate charge-to-mass ratio. The mass analysis magnet is required because the ion source 14, in addition to generating ions of appropriate charge-to-mass ratio, also generates ions of greater or lesser charge-to-mass ratio than that desired. Ions having inappropriate charge-to-mass ratios are not suitable for implantation into the wafer.

The ion beam that passes through the mass analysis magnet 16 is typically comprised of a single isotope and enters the RF linac 18 which imparts additional energy to the ion beam passing therethrough. The RF linac produces particle accelerating fields which vary periodically with time, the phase of which may be adjusted to accommodate different atomic number particles as well as particles having different speeds. Each of the plurality of resonator modules 20 in the RF linac 18 functions to further accelerate ions beyond the energies they achieve from a previous module. The resolver housing 23 resides downstream of the linac 18. The housing contains a second flag Faraday 35 for measuring the current of the ion beam prior to implanting into the wafer.

Figure 2:
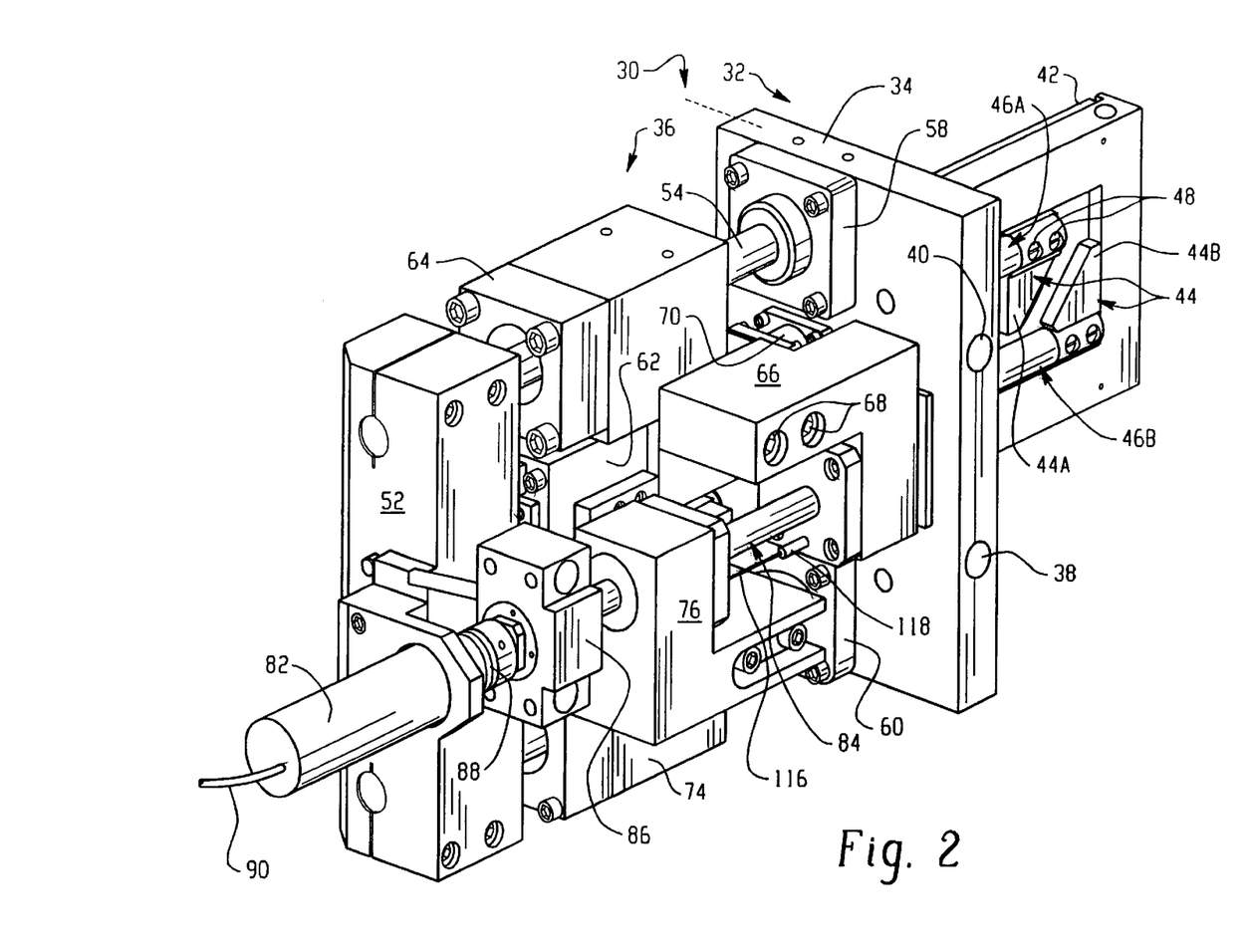
FIG. 2 is a perspective view of the continuously variable aperture assembly shown in the ion implanter of FIG. 1.

The continuously variable aperture 30 disposed between the mass analysis magnet 16 and the RF linac 18 is shown in greater detail in FIG. 2. The aperture 30 comprises an aperture subassembly 32, residing generally interior of a mounting plate 34, and an aperture drive mechanism 36, residing generally exterior of the mounting plate 34. The mounting plate 34 defines the interface between the interior of the implanter beamline, which operates under vacuum conditions, and the exterior of the implanter beamline, which resides at an ambient atmospheric pressure. The mounting plate is cooled by means of a cooling medium (such as water) which is carried by internal channels via inlet 38 and outlet 40.

The aperture subassembly 32 comprises a graphite fixed defining aperture 42 behind which resides a graphite variable aperture 44 comprised of aperture plate 44A and 44B. The aperture plates 44A and 44B are attached to stainless steel control arms 46A and 46B, respectively, by means of fasteners such as screws 48. The gap 50 between the aperture plates 44A and 44B (see FIG. 3) defines a space, having a longitudinal axis 49, through which an ion beam may pass during operation of the ion implanter of FIG. 1. As explained further hereinbelow, the aperture drive mechanism 36 moves the control arms 46A and 46B toward and away from each other in a direction parallel to axis 51 to vary the width of the gap 50 between aperture plates 44A and 44B. Axis 51 is generally perpendicular to the axis along which the ion beam travels.

Figure 3:
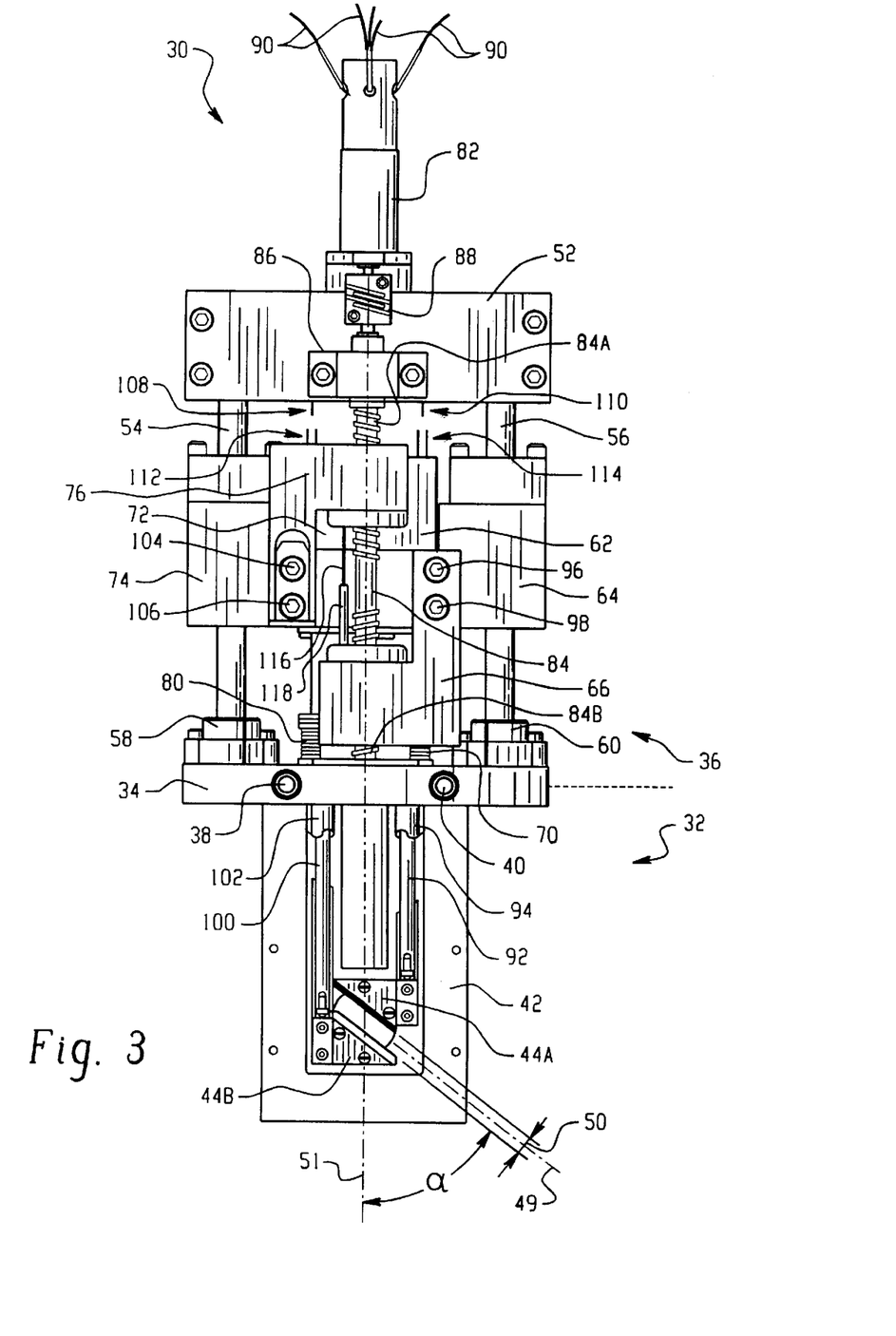
FIG. 3 is a plan view of the continuously variable aperture assembly of FIG. 2.

With reference to FIGS. 2 and 3, the aperture drive mechanism 36 includes a fixed mounting block 52 that is fixedly spaced from the mounting plate 34 by means of linear shafts or ways 54 and 56. The linear ways 54 and 56 are attached to the mounting plate 34 by means of mountings 58 and 60, respectively. The linear ways 54 and 56 provide means along which the movable portion of the drive mechanism slides to permit adjustment of the gap 50 between the aperture plates 44A and 44B.

Control arm 46A (to which aperture plate 44A is attached) is connected to block assembly, 62, 64, 66, which slides bi-directionally along linear way 56. The control arm 46A is fixedly attached to block 62; block 62 is fixedly attached to block 64; and block 64 is fixedly attached to block 66. Accordingly, by moving block 66 in a direction parallel to axis 51, movement is imparted to block 64 which slides along linear way 56, thereby imparting corresponding axial movement to block 62 and the control arm 46A. Thus, the entire block assembly 62, 64, 66 moves in a direction parallel to axis 51. An expansible steel bellows 70 is provided at the interface of the control arm 46A and the exterior of the mounting plate 34 to maintain vacuum conditions on the interior side of the mounting plate, while permitting the control arm 46A to move through the mounting plate.

Similarly, control arm 46B (to which aperture plate 44B is attached) is connected to block assembly, 72, 74, 76, which slides bi-directionally along linear way 54. The control arm 46B is fixedly attached to block 72; block 72 is fixedly attached to block 74; and block 74 is fixedly attached to block 76. Accordingly, by moving block 76 in a direction parallel to axis 51, movement is imparted to block 74 which slides along linear way 54, thereby imparting corresponding axial movement to block 72 and the control arm 46B. Thus, the entire block assembly 72, 74, 76 moves in a direction parallel to axis 51. An expansible steel bellows 80 is provided at the interface of the control arm 46B and the exterior of the mounting plate 34 to maintain vacuum conditions on the interior side of the mounting plate, while permitting the control arm 46B to move through the mounting plate.

The block assemblies 61, 64, 66 and 72, 74, 76 are moved toward and away from each other in opposite directions parallel to axis 51 by a motorized threaded shaft assembly including a DC motor 82 and a threaded shaft 84. The threaded shaft 84 is provided with a first threaded portion 84A having an end that is connected to the mounting block 52 by a bearing mount 86. The threaded shaft 84 is provided with a second oppositely threaded portion 84B having an end that is connected to mounting plate 34 by an internal bearing (not shown). As such, the threaded shaft 84 is secured at its ends to the mounting block 52 and the mounting plate 34 while being permitted to rotate bi-directionally along axis 51. Block 76 is provided with internal threads that match those of the first threaded portion 84A, and block 66 is provided with internal threads that match those of the second oppositely threaded portion 84B.

DC motor 82 is coupled to the threaded shaft 84 by means of shaft coupling 88. Power is supplied to the motor 82 via leads 90. By applying oppositely biased voltages to the DC motor, the threaded shaft 84 may be rotated in opposite directions. Because the first threaded portion 84A and the second threaded portion 84B are oppositely threaded, rotation of the threaded shaft moves the block assembly 62, 64, 66 in one direction parallel to axis 51 and moves the block assembly 72, 74, 76 in an opposite direction parallel to axis 51. The block assemblies are connected to their respective control arms 46A and 46B. Thus, by selecting the correct polarity of the voltage operating the DC motor 82, the width of the aperture gap 50 may be made smaller or larger by moving the aperture plates 44A and 44B toward or away from each other. In this manner, ion beam current passing through aperture 44 may be adjusted. The aperture plates 44A and 44B may either overlap or abut each other in the closed position to insure that no beam current passes therethrough. In the preferred embodiment, the tilt angle $\alpha$ defined by the axis 49 of aperture 44 and axis 51 is fixed on the order of 45°.

An alternative to the motorized threaded shaft assembly provided in FIGS. 2 and 3 is a motorized rack and pinion assembly (not shown). The motorized rotary movement of a pinion located between a pair of rack bars may be used to impart opposing movement to the rack bars. By connecting each of the rack bars to a respective control arm, rotary movement of the pinion by the motor may be used to adjust the aperture gap.

Because the ion beam current passing through the aperture 44 may generate significant heat, the control arms 46A and 46B are cooled by a medium such as water. Control arm 46A is provided with a coaxial construction utilizing an inner sheath 92 into which water is injected via inlet 96 and an outer sheath 94 through which water exits via outlet 98. Similarly, control arm 46B is provided with a coaxial construction utilizing an inner sheath 100 into which water is injected via inlet 104 and an outer sheath 102 through which water exits via outlet 106.

The position of the control arms 46A and 46B may be monitored using proximity switches 108 and 110 that are mounted to mounting block 52. Fins 112 and 114, mounted to blocks 72 and 62, respectively, activate switches 108 and 110, respectively, when they are in close proximity thereto. When switch 108 is activated, the aperture 44 is in its most closed position, and when switch 110 is activated, the aperture 44 is in its most open position (roughly 0.16" (0.41 cm) in the preferred embodiment). In addition, a linear potentiometer comprising a plunger 116 and a receiving portion 118 may be included with the threaded shaft assembly for providing an indication of the distance between block assemblies 62, 64, 66 and 72, 74, 76, thereby providing an indication of the position of the aperture 44 and thus the width of the aperture gap 50. Alternatively, a rotary encoder may be coupled to the DC motor shaft or the threaded shaft 84 to provide such position information.

Figure 4:
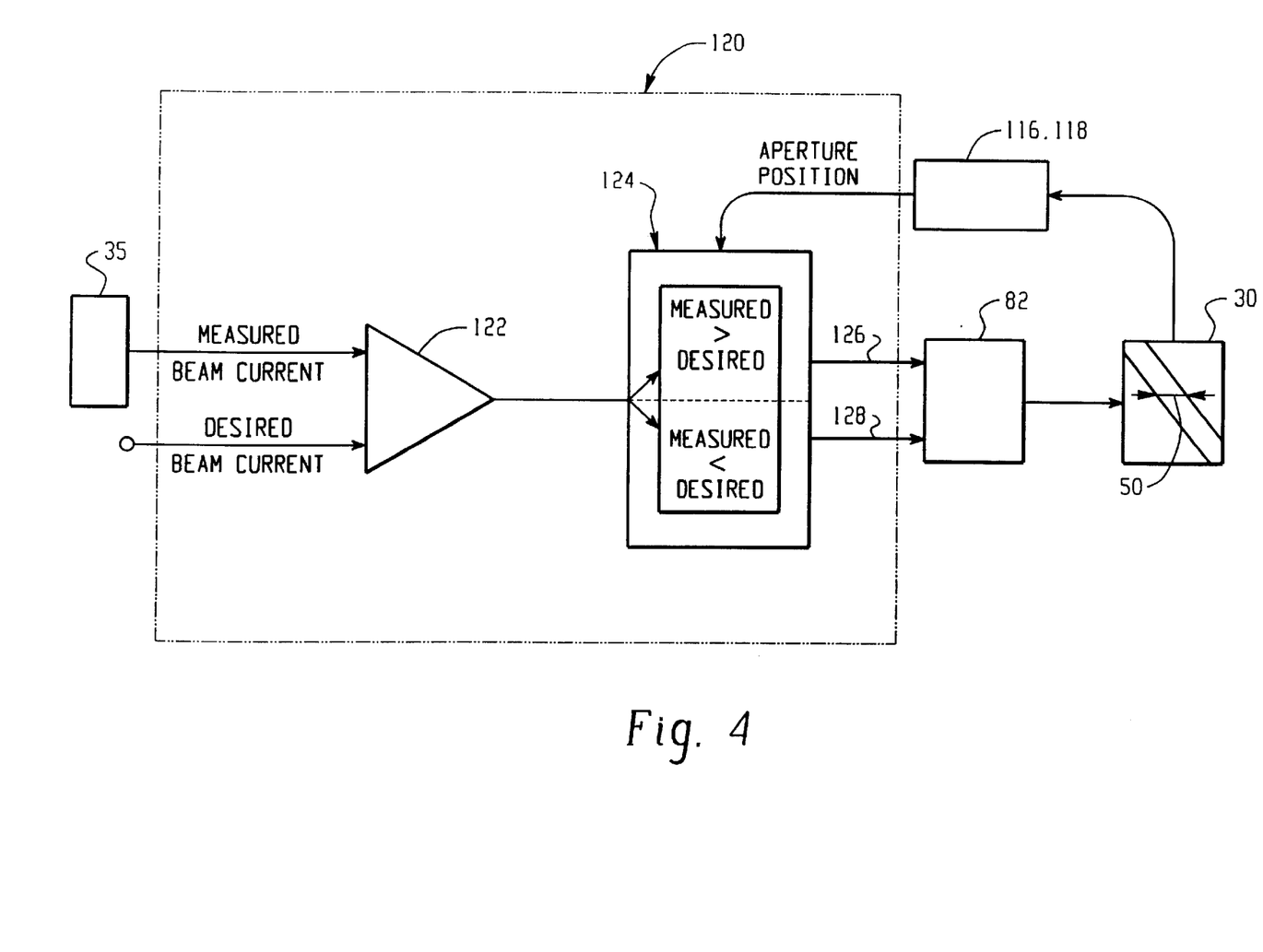
FIG. 4 is a circuit schematic showing a control loop mechanism that is used to control the continuously variable aperture of FIGS. 2 and 3.

FIG. 4 is a schematic showing a closed loop circuit or control mechanism 120 that is used to control the continuously variable aperture of FIGS. 2 and 3. The mechanism 120 may be implemented in either software or hardware. Inputs to the circuit 120 are the desired ion beam current as defined by the particular recipe being run, an ion beam current measurement provided by second flag Faraday 35, and an aperture position indication provided by the linear potentiometer 116, 118. The output of the circuit 120 is a control signal or signals provided to the DC motor 82 to control movement of the control arms and thus the gap 50 of the aperture 44.

A comparator 122 compares the desired ion beam current with the measured beam current from the second flag Faraday 35. This beam current information is provided every 50 milliseconds and is stored in a software database. The output of the comparator is input into a motor controller 124 including control logic that controls the motor 82 based on whether the measured ion beam current is greater than or less than the desired ion beam current. If the measured ion beam current is greater than the desired ion beam current, the motor controller issues a first control signal 126 to the DC motor to rotate in a first direction to move the aperture plates 44A and 44B closer together. Thus, the aperture gap 50 is narrowed, and less ion beam current is delivered to the linac 18.

However, if the measured ion beam current is less than the desired ion beam current, the motor controller issues a second control signal 128 to the DC motor to rotate in a second direction (opposite the first direction) to move the aperture plates 44A and 44B further apart. Thus, the aperture gap 50 is widened, and more ion beam current is delivered to the linac 18. Additionally, the motor controller 124 is provided with an aperture position feedback signal from the linear potentiometer 116, 118. (As such, the control circuit 120 operates in a closed loop manner.)

Figure 5:
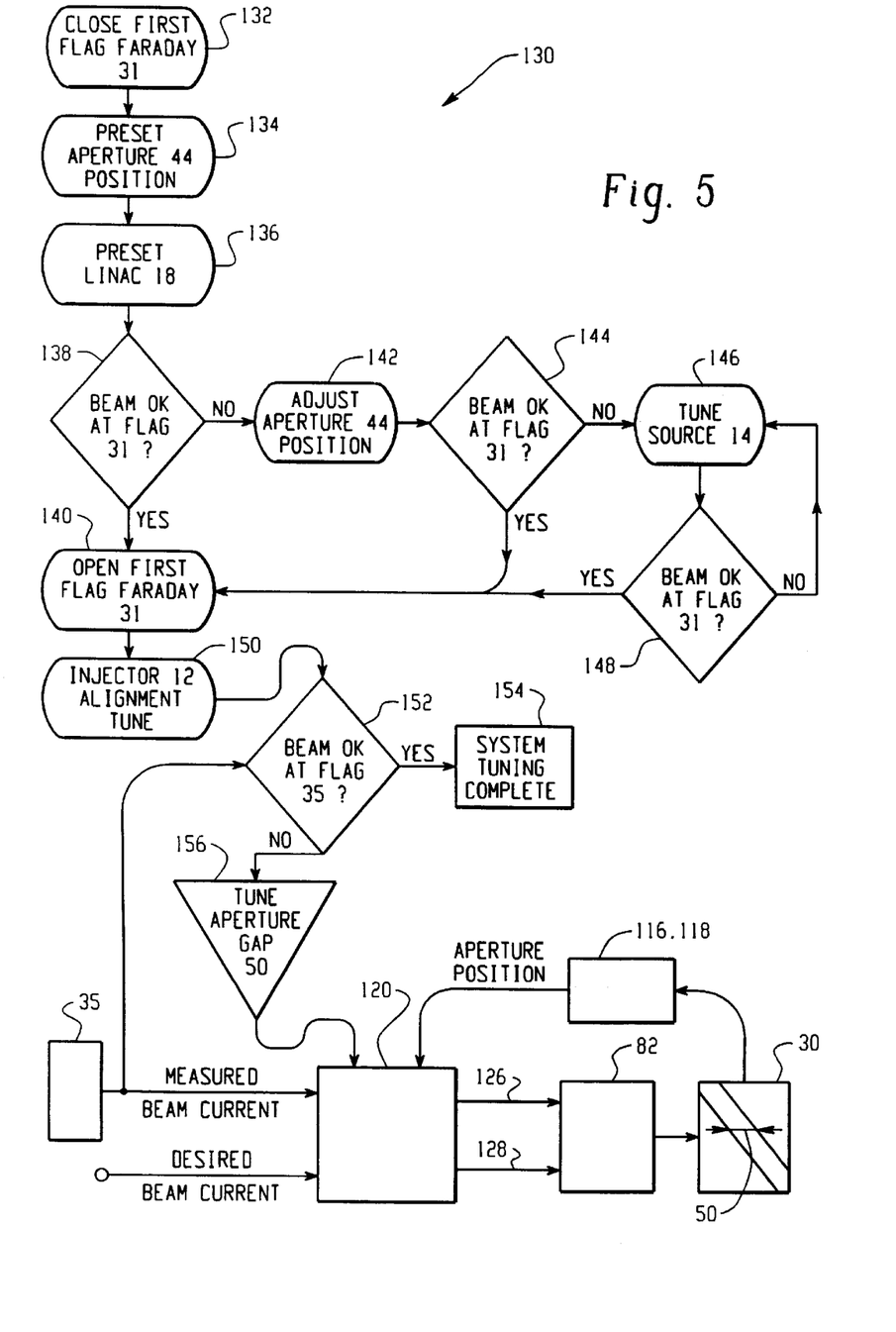
FIG. 5 is a schematic flow chart representing the overall control algorithm utilized for tuning the ion beam current of the ion implanter of FIG. 1, based on prescribed operating parameters, which includes the aperture control mechanism of FIG. 4.

The aperture control mechanism of FIG. 4 is part of an overall control algorithm utilized for tuning the ion beam current of the ion implanter of FIG. 1 based on desired operating parameters and sensed operating conditions. A schematic flow chart representing this overall control algorithm 130, which may be implemented in hardware or software, is shown in FIG. 5. A first step 132 of the system tuning method 130 involves closing the first flag Faraday 31 by positioning the flag in the path of the ion beam, as is known in the art, at the location immediately downstream of the continuously variable aperture 30. Then, in step 134, the position of the aperture 44 is preset, which comprises setting the gap 50 of the aperture based on implanter past operational history. Next, in step 136, the linac 18 is preset to desired operating parameters.

Decision 138 involves measuring the ion beam current with the first flag Faraday 31. If the beam current is within an acceptable range, such that fine tuning of the continuously variable aperture 30 will result in an acceptable beam current measured downstream at the second flag Faraday 35, the first flag Faraday 31 is opened in step 140 and the ion beam is permitted to travel through the aperture 30 and into the linac 18. If, however, the beam current measured by the first flag Faraday 31 is outside of the acceptable range, such that tuning the continuously variable aperture 30 will not result in an acceptable beam current measured downstream at the second flag Faraday 35, the aperture 44 position must be adjusted (i.e., coarsely tuned) in step 142.

After coarsely tuning the aperture 44 position, if at decision 144 the beam current measured by the first flag Faraday 31 is within the acceptable range, the first flag Faraday 31 is opened. If, however, the beam current measured by the first flag Faraday 31 is still outside the acceptable range, the ion beam source 14 must be re-tuned in step 146. After re-tuning the source 14, if at decision 148 the beam current measured by the first flag Faraday is within the acceptable range, the first flag Faraday 31 is opened. If, however, the beam current measured by the first flag Faraday 31 is still outside the acceptable range, the ion beam source 14 must again be re-tuned in step 146. The loop provided by steps 146 and 148 is not infinite in nature as a time-out mechanism is provided should the source 14 prove to be not tunable to the desired current output.

Next, in step 150, the injector 12 is tuned for alignment of the beam into the linac 18. Decision 152 involves measuring the ion beam current with the second flag Faraday 35. If the beam current is within an acceptable range, system tuning is complete at step 154 and the second flag Faraday 35 may be opened. If, however, the beam current is not within the acceptable range, the aperture gap 50 must be fine-tuned at step 156 by invoking the closed loop circuit or control mechanism 120 of FIG. 4. Because circuit 120 is closed loop, the aperture position will be continuously adjusted until the measured beam current at second flag Faraday 35 is within the acceptable range. At this point, system tuning is complete at step 154 and the second flag Faraday may be opened.

By using the method of FIG. 5, significant changes in the ion beam current may be quickly accomplished without re-tuning the ion source, which would otherwise be a much more time consuming process. In addition, the present invention provides a much more direct and precise method of changing the beam current. To the contrary, re-tuning the ion source is a much more reactive, indirect process that requires an analysis of the effect of each adjustment before further adjustments are made, and which cannot provide the precise beam current tuning offered by the present invention. For example, in a preferred embodiment, the position of the aperture 44 may be controlled to a fineness of about 5 microns ($\mu$m) (i.e., each control arm moving it respective aperture plate 2.5 microns ($\mu$m)), which may correspond to a mere 0.1% change in the beam current. That is, assuming that the beam current is homogenous across the width of the aperture gap 50, and, for example, with an injected current of 100 microamps ($\mu$A) with the aperture 44 fully open, the beam current may be controlled downward in steps as little as 1 microamp ($\mu$A).

Figure 6:
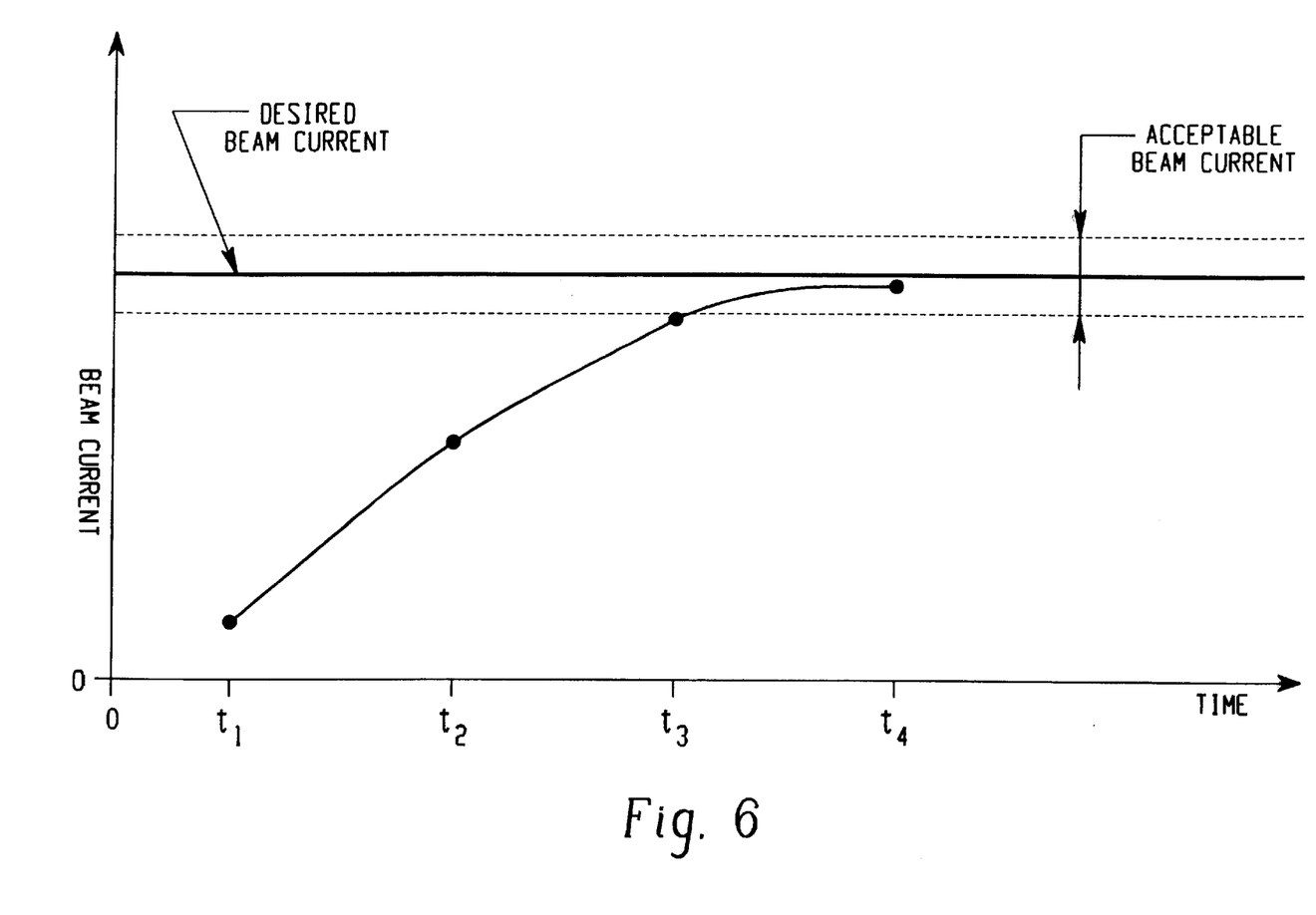
FIG. 6 is a graphical representation of beam current response to adjustment of the control loop mechanism of FIG. 4, based on a first preferred control method.
Figure 7:
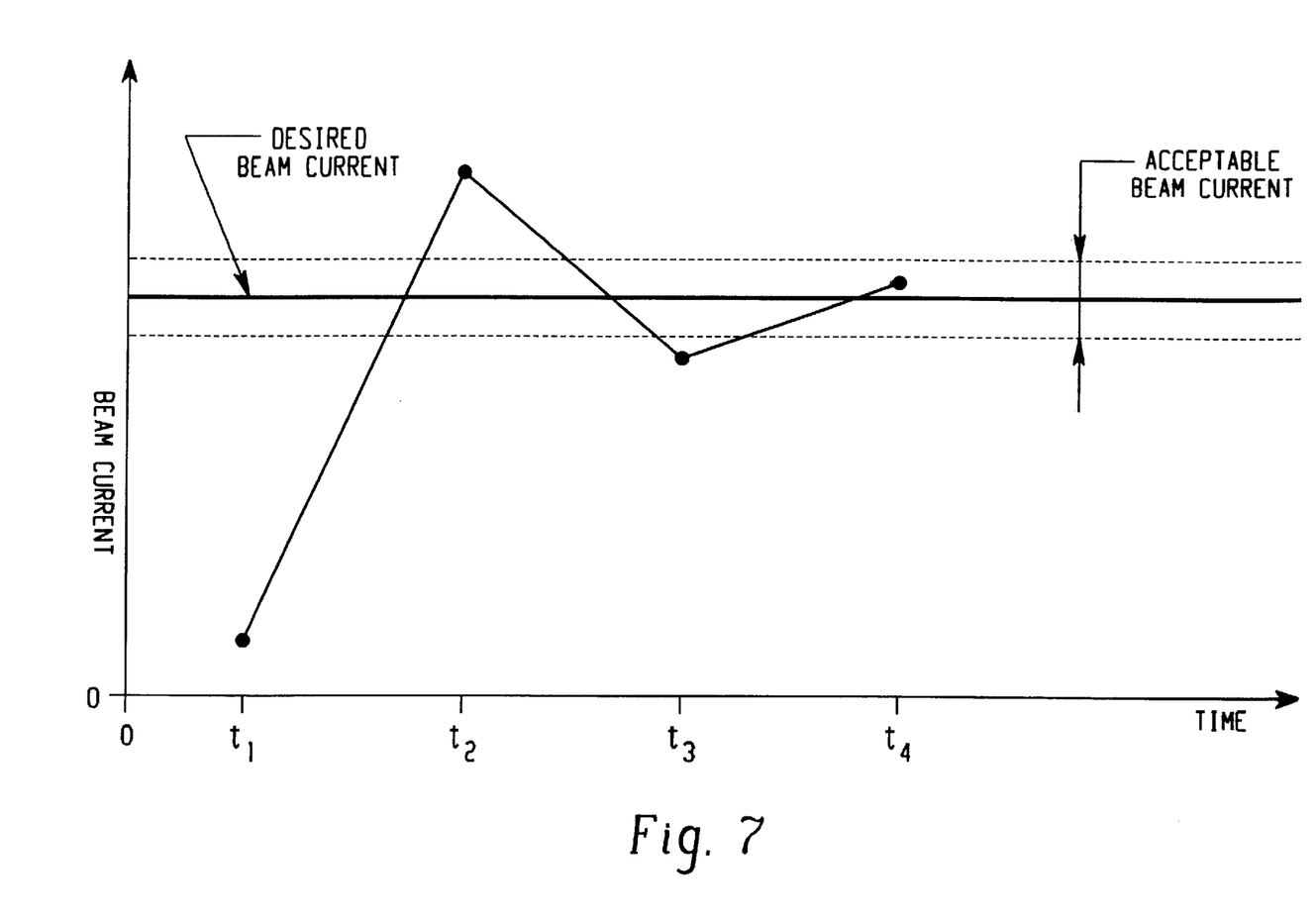
FIG. 7 is a graphical representation of beam current response to adjustment of the control loop mechanism of FIG. 4, based on a second preferred control method.

In operation, using the logic of FIG. 4, circuit 120 looks at desired beam current, measured beam current (from second flag Faraday 35), and aperture position (from either the linear potentiometer or rotary encoder). The comparison of measured and desired beam current is made at least once each second in the preferred mode of operation. FIGS. 6 and 7 are graphical representations of beam current response to the adjustment of the aperture position using the logic of FIG. 4. FIG. 6 is based on a first preferred control method, referred to herein as the asymptotic method. FIG. 7 is based on a second preferred control method, referred to as the bi-section method.

In the asymptotic method (FIG. 6), at time $t_1$ an error signal is generated by circuit 120 based on the difference between the desired beam current versus actual beam current. The present aperture position is determined based on potentiometer or encoder feedback. If measured current is greater than desired current (not shown), control signal 126 is generated to narrow the aperture gap 50 by rotating the motor 82 in one direction, and if measured current is less than desired current (FIG. 6), control signal 128 is generated to widen the aperture gap 50 by rotating the motor 82 in the other direction. Aperture position feedback may be used so that the control circuit 120 can determine the present aperture position and the estimated required aperture position.

At time $t_2$, approximately one second or less after time $t_1$, a second error signal is generated and again control signal 128 continues to drive the motor to widen the aperture gap 50. In FIG. 6, two additional comparisons of desired versus measured current are made (at times $t_3$ and $t_4$), and corresponding error signals are shown. This procedure continues until the measured beam current falls within the acceptable range.

The speed at which the motor 82 is driven, and hence at which the aperture is widened or narrowed, depends on the magnitude of the error signal and the aperture position. Thus, in FIG. 6 at $t_1$, when the first (greatest magnitude) error signal is generated, the motor is driven at a faster rate. At subsequent times ($t_2$–$t_4$), the magnitude of the error signal becomes progressively smaller, and the motor is driven slower. Also, as the error signal magnitude approaches zero, the motor is prematurely instructed to stop to accommodate momentum within the system. As such, the measured current shown in FIG. 6 does not overshoot its desired beam current target but instead asymptotically approaches the beam current target.

In the bi-section method (FIG. 7), at time $t_1$ a comparison is made by circuit 120 of desired beam current versus actual beam current. The present aperture position is determined based on potentiometer or encoder feedback. If measured current is greater than desired current (not shown), control signal 126 is generated to narrow the aperture gap 50 by rotating the motor 82 in one direction, and if measured current is less than desired current (FIG. 7), control signal 128 is generated to widen the aperture gap 50 by rotating the motor 82 in the other direction.

In the bi-section method, the motor 82 is instructed to move the aperture from its position at $t_1$ to a position at $t_2$ which represents half the maximum distance it could move in the correct direction. Thus, if the potentiometer or encoder indicates that the aperture is at position 20 (with position 0 indicating fully closed and position 100 indicating fully open), and measured beam current is less than desired beam current, the motor 82 is instructed to move from position 20 (nearly closed) to position 60 (at least half open). The 40 increment widening of the gap (from position 20 to position 60) represents half of the difference between the present position 20 and the fully open position 100.

At time $t_2$, a second comparison is made by circuit 120 of desired beam current versus actual beam current. Again the present aperture position (60) is determined. In the case of FIG. 7, the desired beam current has been exceeded (overshot) and thus the motor 82 is instructed to close to position 40 (half the distance between the present position 60 and the original position 20). At time $t_3$, a third comparison is made and aperture position (40) is determined. As shown in FIG. 7, the desired beam current has been undershot and thus the motor 82 is instructed to open to position 50 (half the distance between the present position 40 and the previous position 60). At time $t_4$, a fourth comparison is made and, because measured beam current is now within an acceptable range, the aperture position remains fixed at position 50.

In practice, it has been found that by using the continuously variable aperture 30 of the present invention, the beam current may be tuned for a particular recipe within a very short time, on the order of 20 seconds. This time is contrasted to that required to re-tune the source if the continuously variable aperture is not used, which has been found to be on the order of two to three minutes. As such, the present invention provides an efficient, rapid mechanism for tuning the ion beam current in the implanter 10.

Accordingly, a preferred embodiment of a method and system for operating a variable aperture in an ion implanter has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A method of closed loop control of a variable aperture (30) for adjusting the amount of ion beam current passing therethrough in an ion implantation system (10), comprising the steps of:
   (i) measuring ion beam current at an implanter location using a current detector (35);
   (ii) comparing said measured ion beam current with a desired ion beam current;
   (iii) outputting a control signal (126, 128) based on the comparison of said measured ion beam current with said desired ion beam current;
   (iv) adjusting a gap (50), through which through ion beam passes and which is defined by opposing first and second aperture plates (44A, 44B), in response to said control signal to control the amount of ion beam current passing therethrough; and
   (v) determining the position of said aperture plates (44A, 44B), such that any further subsequent outputting of said control signal (126, 128) is additionally based on said determination of aperture plate position.

2. The method of claim 1, wherein said step of determining the position of said aperture plates (44a, 44B) includes the step of providing a position sensor (116, 118), and wherein said control signal (126, 128) is output to a motor (82) that controls movement of an aperture drive mechanism (36).

3. The method of claim 1, wherein an error signal is generated based on the comparison of said measured ion beam current with said desired ion beam current, and said control signal (126, 128) is additionally based on a magnitude of said error signal.

4. The method of claim 3, wherein said error signal is generated and said gap (50) is repeatedly adjusted at least once per second until said measured ion beam current asymptotically approaches within a specified value of said desired ion beam current.

5. The method of claim 3, wherein said error signal is generated and said gap (50) is repeatedly adjusted at regular intervals, and wherein said control signal (126, 128) successively adjusts said gap at each interval such that the measured ion beam current overshoots said desired ion beam current until said measured ion beam current is within a specified value of said desired ion beam current.

6. The method of claim 3, wherein said gap (50) is adjustable in increments of about 5 microns ($\mu$m).

7. A method of adjusting ion beam current outputted by a current source (14) in an ion implanter (10), by adjusting the position of an aperture (44) through which the ion beam current passes, comprising the steps of:
(i) initially measuring ion beam current using a first detector (31) by closing said detector (31) to block said ion beam;
(ii) determining if said measured ion beam current is within a specified range and either (a) opening said first detector (31) and allowing the ion beam to travel to a second detector (35) if said current is within said specified range, and skipping to step (iv) or (b) coarsely tuning the position of the aperture (44) if said current is not within said specified range;
(iii) subsequently determining if said measured ion beam current is within said specified range and either (a) opening said first detector (31) and allowing the ion beam to travel to said second detector (35) if said current is within said specified range, and skipping to step (iv) or (b) tuning said ion beam source (14), if said current is not within said specified range, until said current is within said specified range;
(iv) subsequently measuring ion beam current using said second detector (35) by closing said second detector (35) to block said ion beam; and
(v) subsequently determining if said measured ion beam current is within a second specified range and either (a) opening said second detector (35) or (b) finely tuning the position of the aperture (44) if said current is not within said second specified range.

8. The method of claim 7, further comprising the initial step of presetting the position of the aperture (44) based on implanter past operational history.

9. The method of claim 7, wherein the step (v)(b) of finely tuning the position of the aperture 44 comprises the steps of:
(i) measuring ion beam current at the location of second detector (35);
(ii) comparing said measured ion beam current with a desired ion beam current;
(iii) outputting a control signal (126, 128) based on the comparison of said measured ion beam current with said desired ion beam current; and
(iv) adjusting a gap (50), through which through ion beam passes and which is defined by opposing first and second aperture plates (44A, 44B), in response to said control signal to control the amount of ion beam current passing therethrough.

10. The method of claim 9, further comprising the step of determining the position of said aperture plates (44A, 44B), and wherein said step of outputting said control signal (126, 128) is additionally based on said determination of aperture plate position.

11. The method of claim 10, wherein said step of determining the position of said aperture plates (44a, 44B) includes the step of providing a position sensor (116, 118), and wherein said control signal (126, 128) is output to a motor (82) that controls movement of an aperture drive mechanism (36).

12. The method of claim 10, wherein an error signal is generated based on the comparison of said measured ion beam current with said desired ion beam current, and said control signal (126, 128) is additionally based on a magnitude of said error signal.

13. The method of claim 12, wherein said error signal is generated and said gap (50) is repeatedly adjusted at least once per second until said measured ion beam current asymptotically approaches within a specified value of said desired ion beam current.

14. The method of claim 12, wherein said error signal is generated and said gap (50) is repeatedly adjusted at regular intervals, and wherein said control signal (126, 128) successively adjusts said gap at each interval such that the measured ion beam current overshoots said desired ion beam current until said measured ion beam current is within a specified value of said desired ion beam current.

15. The method of claim 12, wherein said gap (50) is adjustable in increments of about 5 microns ($\mu$m).

16. A system for adjusting ion beam current outputted by a current source (14) in an ion implanter (10), by adjusting the position of an aperture (44) through which the ion beam current passes, comprising:
(i) a first detector (31) for measuring ion beam current when in a closed position blocking said ion beam;
(ii) means for initially determining if said measured ion beam current is within a specified range and either (a) opening said first detector (31) and allowing the ion beam to travel to a second detector (35) if said current is within said specified range, and skipping to step (iv) or (b) coarsely tuning the position of the aperture (44) if said current is not within said specified range;
(iii) means for subsequently determining if said measured ion beam current is within said specified range and either (a) opening said first detector (31) and allowing the ion beam to travel to a second detector (35) if said current is within said specified range, and skipping to step (iv) or (b) tuning said ion beam source (14), if said current is not within said specified range, until said current is within said specified range;
(iv) said second detector (35) for measuring ion beam current when in a closed position blocking said ion beam; and
(ii) means for subsequently determining if said measured ion beam current is within a second specified range and either (a) opening said second detector (35) or (b) finely tuning the position of the aperture (44) if said current is not within said second specified range.

17. The system of claim 16, wherein said aperture (44) comprises a gap (50) defined by aperture plates (44A, 44B), and further comprising means for presetting the position of the aperture (44) based on implanter past operational history.

18. The system of claim 16, wherein said means for finely tuning said position of said aperture (44) comprises a position sensor (116, 118) for sensing the position of said aperture (44), and said second detector (35) provides ion beam current feedback.

19. The system of claim 16, wherein said gap (50) is adjustable in increments of about 5 microns ($\mu$m).

* * * * *